United States Patent
Hou et al.

(10) Patent No.: US 11,715,746 B2
(45) Date of Patent: Aug. 1, 2023

(54) DETECTION ELEMENT, MANUFACTURING METHOD THEREOF, FLAT PANEL DETECTOR

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Xuecheng Hou, Beijing (CN); Pengcheng Tian, Beijing (CN); Chuncheng Che, Beijing (CN); Chia Chiang Lin, Beijing (CN); Xin Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/747,055

(22) Filed: May 18, 2022

(65) Prior Publication Data
US 2022/0278146 A1 Sep. 1, 2022

Related U.S. Application Data

(63) Continuation of application No. 16/331,326, filed as application No. PCT/CN2018/101951 on Aug. 23, 2018, now Pat. No. 11,355,534.

(30) Foreign Application Priority Data

Oct. 17, 2017 (CN) .......................... 201710967141.4

(51) Int. Cl.
*H01L 27/146* (2006.01)

(52) U.S. Cl.
CPC .. *H01L 27/14603* (2013.01); *H01L 27/14663* (2013.01); *H01L 27/14683* (2013.01); *H01L 27/14623* (2013.01)

(58) Field of Classification Search
CPC ......... H01L 27/14603; H01L 27/14663; H01L 27/14683; H01L 27/14623;
(Continued)

(56) References Cited

U.S. PATENT DOCUMENTS

| 5,512,748 | A | 4/1996 | Hanson |
| 7,847,326 | B2 | 12/2010 | Park |

(Continued)

FOREIGN PATENT DOCUMENTS

| CN | 103137641 A | 6/2013 |
| CN | 103165635 A | 6/2013 |

(Continued)

OTHER PUBLICATIONS

First Office Action issued by the Chinese Patent Office in the priority Chinese application No. 201710967141.4 dated Apr. 28, 2020.

*Primary Examiner* — Seung C Sohn
(74) *Attorney, Agent, or Firm* — Dilworth & Barrese, LLP.; Michael J. Musella, Esq.

(57) ABSTRACT

A detection element, a manufacturing method thereof and a flat panel detector are disclosed. The detection element includes: a base substrate; a first electrode on the base substrate; a photoelectric conversion layer; a transparent electrode and a second electrode electrically connected with the transparent electrode on a side of the photoelectric conversion layer away from the first electrode. An orthographic projection of the photoelectric conversion layer on the base substrate completely falls within an orthographic projection of the first electrode on the base substrate, in a plane parallel to the base substrate, the transparent electrode is located at a middle portion of the photoelectric conversion layer not covered by the transparent electrode on the base substrate at least partially falls within (Continued)

an orthographic projection of the second electrode on the base substrate.

20 Claims, 4 Drawing Sheets

(58) Field of Classification Search
CPC ......... H01L 27/14612; H01L 27/14692; H01L 27/14658; H01L 27/12; H01L 27/14643
See application file for complete search history.

(56) References Cited

U.S. PATENT DOCUMENTS

| | | | |
|---|---|---|---|
| 9,484,384 B2* | 11/2016 | Yang | ................... H01L 27/1462 |
| 10,096,642 B2 | 10/2018 | Ishino | |
| 10,276,611 B2* | 4/2019 | Nakano | ............. H01L 27/14603 |
| 10,468,450 B2 | 11/2019 | Karim | |

FOREIGN PATENT DOCUMENTS

| | | | |
|---|---|---|---|
| CN | 107104108 A | 8/2017 |
| EP | 3627554 A1 | 3/2020 |
| JP | 2006005077 A | 1/2006 |

\* cited by examiner

DETECTION ELEMENT, MANUFACTURING METHOD THEREOF, FLAT PANEL DETECTOR

The present application is a continuation of U.S. patent application Ser. No. 16/331,326 filed on Mar. 7, 2019, which is a U.S. National Phase Entry of International Application No. PCT/CN2018/101951 filed Aug. 23, 2018, which claims priority to and the benefit of Chinese patent application No. 201710967141.4 filed on Oct. 17, 2017. The above-identified applications are incorporated by reference herein in their entirety.

TECHNICAL FIELD

At least one embodiment of the present disclosure relates to a detection element, a manufacturing method thereof, and a flat panel detector.

BACKGROUND

X-ray detection is widely used in modern medical image detection. Currently, the most advanced direct digital radiography (DR) is a technology which adopts an one-dimensional or two-dimensional X-ray detector to directly convert X-ray information into digital image information under the control of a computer with image processing function. A two-dimensional flat X-ray panel detector (FPXD) used in the current DR equipment includes a direct flat panel detector and an indirect flat panel detector.

SUMMARY

At least one embodiment of the present disclosure provides a detection element, a manufacturing method thereof, and a flat panel detector.

At least one embodiment of the present disclosure provides a detection element, including: a base substrate; a first electrode on the base substrate; a photoelectric conversion layer on a side of the first electrode away from the base substrate; a transparent electrode on a side of the photodiode away from the first electrode and a second electrode electrically connected with the transparent electrode; an orthographic projection of the photoelectric conversion layer on the base substrate completely falls within an orthographic projection of the first electrode on the base substrate, in a plane parallel to the base substrate, the transparent electrode is located at a middle portion of the photoelectric conversion, an orthographic projection of a portion of the photoelectric conversion layer not covered by the transparent electrode on the base substrate at least partially falls within an orthographic projection of the second electrode on the base substrate, the detection element further comprises a bias signal line on a side of the transparent electrode away from the photoelectric conversion layer. The bias signal line is electrically connected with the transparent electrode, and the second electrode is electrically connected with the bias signal line.

For example, the orthographic projection of the portion of the photoelectric conversion layer not covered by the transparent electrode on the base substrate completely falls within the orthographic projection of the second electrode on the base substrate.

For example, the detection element further includes: an insulating layer between the bias signal line and the transparent electrode. The second electrode is on a side of the insulting layer away from the transparent electrode.

For example, an orthographic projection of the second electrode on the base substrate falls within an orthographic projection of the first electrode on the base substrate.

For example, a material of the second electrode comprises metal.

For example, the detection element further includes a thin film transistor comprising a source electrode and a drain electrode. One of the source electrode and the drain electrode is the first electrode.

For example, an orthographic projection of the bias signal line on the base substrate is overlapped with an orthographic projection of the thin film transistor on the base substrate.

For example, a cross section of the photoelectric conversion layer taken in a direction perpendicular to the base substrate has a trapezoid shape, and a length of a base of the trapezoid shape close to the transparent electrode is smaller than a length of a base of the trapezoid shape close to the first electrode.

For example, an orthographic projection of the bias signal line on the base substrate is overlapped with a portion of the orthographic projection of the photoelectric conversion layer on the base substrate, and an orthographic projection of a portion of the photoelectric conversion layer not covered by the transparent electrode and the bias signal line on the base substrate completely falls into the orthographic projection of the second electrode on the base substrate.

For example, the insulating layer comprises a via hole, and the bias signal line is electrically connected with the transparent electrode through the via hole.

For example, the second electrode and the bias signal line are in a same layer and materials of the second electrode and the bias signal line are the same.

For example, the orthographic projection of the transparent electrode on the base substrate is not overlapped with the orthographic projection of the second electrode on the base substrate.

At least one embodiment of the present disclosure provides a manufacturing method of a detection element, including: forming a first electrode on a base substrate, forming a photoelectric conversion layer on a side of the base substrate away from the first electrode; and forming a transparent electrode on a side of the photoelectric conversion layer away from the first electrode, a second electrode electrically connected with the transparent electrode and a bias signal line. The bias signal line is on a side of the transparent electrode away from the photoelectric conversion layer, the bias signal line is electrically connected with the transparent electrode, and the second electrode is electrically connected with the bias signal line. An orthographic projection of the photoelectric conversion layer on the base substrate completely falls within an orthographic projection of the first electrode on the base substrate, in a plane parallel to the base substrate, the transparent electrode is located at a middle portion of the photoelectric conversion, an orthographic projection of a portion of the photoelectric conversion layer not covered by the transparent electrode on the base substrate at least partially falls within an orthographic projection of the second electrode on the base substrate.

For example, the orthographic projection of the portion of the photoelectric conversion layer not covered by the transparent electrode on the base substrate completely falls within the orthographic projection of the second electrode on the base substrate.

For example, the manufacturing method of the detection element further includes: further comprising forming an insulating layer between the bias signal line and the transparent electrode. The second electrode is on a side of the insulting layer away from the transparent electrode.

For example, an orthographic projection of the second electrode on the base substrate falls within an orthographic projection of the first electrode on the base substrate.

For example, a material of the second electrode is metal.

For example, the manufacturing method of the detection element further includes forming a thin film transistor comprising a source electrode and a drain electrode. One of the source electrode and the drain electrode is the first electrode, an orthographic projection of the bias signal line on the base substrate is overlapped with an orthographic projection of the thin film transistor on the base substrate At least one embodiment of the present disclosure provides a flat panel detector, including a plurality of detection elements according to any one of the abovementioned embodiments, and the plurality of detection elements are arranged in an array.

For example, the flat panel detector is an indirect flat panel detector.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "On," "under," "right," "left" and the like are only used to indicate relative position relationship.

Figure 1A:
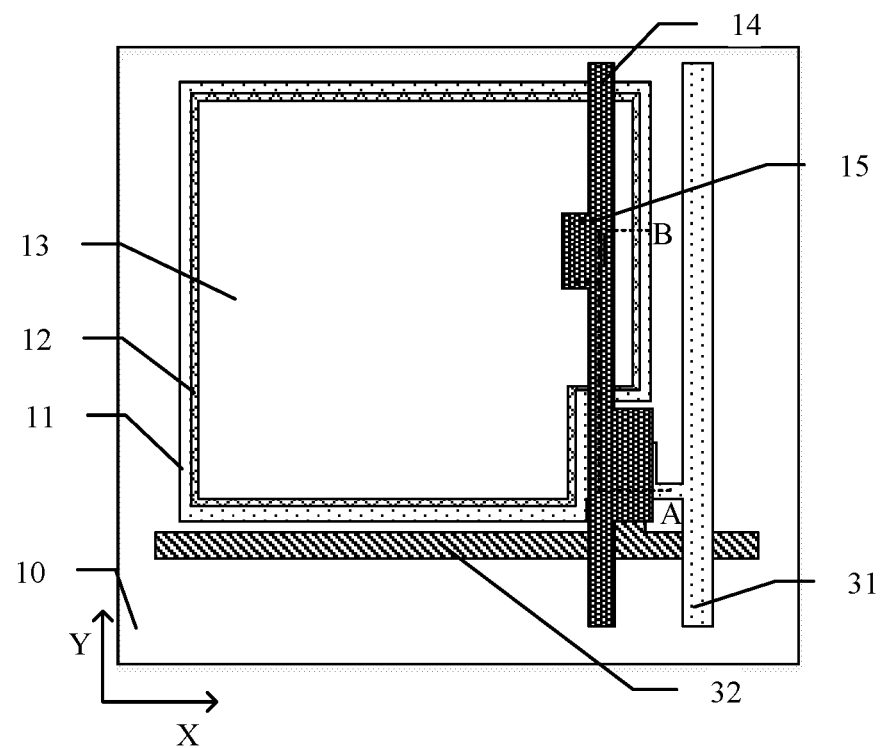
FIG. 1A is a top view of a detection element included in a flat panel detector.
Figure 1B:
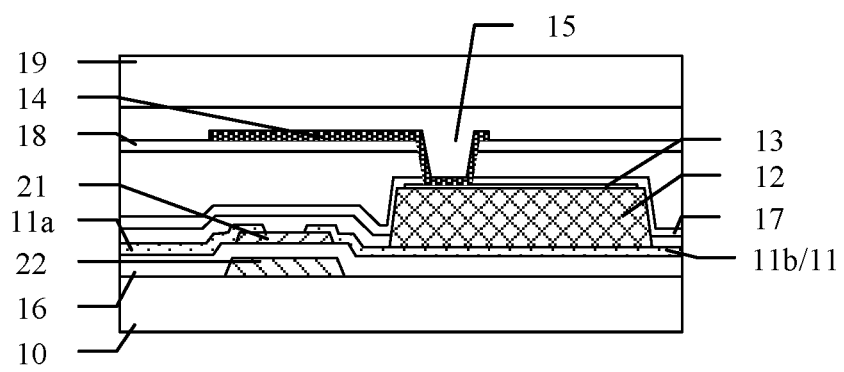
FIG. 1B is a side view of the detection element illustrated by FIG. 1A taken along a line AB.

FIG. 1A is a top view of a detection element included in a flat panel detector, and FIG. 1B is a side view of the detection element illustrated by FIG. 1A taken along a line AB. In order to clearly illustrate a plan view of a photoelectric conversion layer, a top electrode and a bottom electrode which are included in a photodiode, some insulating layers are omitted in FIG. 1A. As illustrated by FIG. 1A and FIG. 1B, the detection element of the flat panel detector includes a base substrate 10; a gate line 32 extending in an X direction and a data line 31 extending in a Y direction which are disposed on the base substrate 10; a thin film transistor disposed on the base substrate 10, the thin film transistor includes a gate electrode 22, a gate insulating layer 16 covering the gate electrode 22, an active layer 21 on the gate insulating layer 16, and source and drain electrodes 11a and 11b. The gate line 32 is connected with the gate electrode 22 to turn on or turn off the thin film transistor, and one of the source and drain electrodes 11a and 11b is connected with the data line 31. In the figure, a case where the source electrode 11a is connected with the data line 31 is shown as an example. The detection element of the flat panel detector further includes a photoelectric conversion layer 12 disposed on the drain electrode 11b, the photoelectric conversion layer 12 uses the drain electrode 11b as its bottom electrode 11; a transparent top electrode 13 disposed on a side of the photoelectric conversion layer 12 away from the bottom electrode 11; film layers such as a buffer layer 17 and a passivation layer 19 which are disposed on the transparent top electrode 13; and a bias signal line 14 on a side of the film layers such as the buffer layer 17 and the passivation layer 18 away from the transparent top electrode 13. The bias signal line 14 is electrically connected with the transparent top electrode 13 through a via hole 15 disposed in the film layers such as the buffer layer 17 and the passivation layer 18. The detection element of the flat panel detector further includes a protective layer 19 disposed on a side of the bias signal line 14 away from the photoelectric conversion layer 12. The photoelectric conversion layer 12 forms an electric field under a bias voltage input from the bias signal line 14, and photoelectrons generated by the photoelectric conversion layer 12 after being irradiated are accumulated in the bottom electrode 11 by an external electric field, after the gate line 32 turns on the thin film transistor, the electrons accumulated in the bottom electrode 11 are read out through the data line 31, and converted into a digital signal by a reading chip, and the digital signal is subjected to an image processing at a backend.

The photodiode illustrated by FIGS. 1A and 1B is a PIN type photodiode including a P layer, an I layer, and an N layer, where the I layer is an intrinsic semiconductor layer or a doped layer of a near-intrinsic semiconductor having a low doping concentration.

In the study, the inventor(s) of the present application notices that: on the one hand, in a flat panel detector using a PIN type photodiode structure, the most important fact affecting the photoelectric characteristics of the flat panel detector is that a dark-state leakage current generated by the photoelectric conversion layer structure is relatively large. The main reasons for the dark-state leakage current of the photoelectric conversion layer include: deposition parameters of the P layer, the I layer, and the N layer need to be optimized; due to the limitation of etching process of the photoelectric conversion layer and the requirements for manufacturing a passivation layer and a resin layer process in subsequent processes, an etched sidewall of the photoelectric conversion layer is not perpendicular to the bottom electrode, but forms an angle of about 75 to 85 degrees with the bottom electrode, i.e., an angle between the sidewall of the photoelectric conversion layer and the bottom electrode is about 75 to 85 degrees. That is, as illustrated by FIG. 1B, due to the limitation of the etching process of the photoelectric conversion layer 12 and the top electrode 13, and the deposition requirements of the film layer such as the resin buffer layer, a cross section of the photoelectric conversion layer 12, which is finally formed, has a trapezoid shape, the angle between the sidewall of the photoelectric conversion layer 12 and the bottom electrode 11 cannot reach 90 degrees, and the top electrode 13 is located at a middle portion of an upper surface of the photoelectric conversion layer 12. Therefore, after a bias voltage being applied to the top electrode 13 and the bottom electrode 11 located on both sides of the photoelectric conversion layer 12, an ineffective bias voltage at the sidewall will generate a large leakage current. Upon the flat panel detector being in operation, the top electrode 13 is applied with a negative bias voltage, the bottom electrode 11 is applied with a positive voltage, and the structure of the photoelectric conversion layer 12 is similar to a capacitor, however, in a plane parallel to the base substrate 10, because a size of the top electrode 13 is smaller than that of the bottom electrode 11, an electric field at the sidewall of the photoelectric conversion layer 12 is weaker than an electric field at the middle position of the photoelectric conversion layer, which will cause a large leakage current, such that the final signal is affected, thereby affecting the leakage current of the entire structure of the detection element, and finally lowering the photoelectric characteristics of the flat panel detector.

On the other hand, an indirect flat panel detector converts X-ray light into visible light by using a scintillation layer, and the converted visible light is relatively divergent. Therefore, the irradiation of the divergent light on the sidewall of an imaging unit (the photoelectric conversion layer) has disadvantageous influence on the image quality.

Embodiments of the present disclosure provide a detection element, a manufacturing method thereof, and a flat panel detector. The detection element includes: a base substrate; a photodiode on the base substrate, the photodiode including: a first electrode on the base substrate; a photoelectric conversion layer on a side of the first electrode away from the base substrate; and a transparent electrode and a second electrode electrically connected with the transparent electrode which are on a side of the photoelectric conversion layer away from the first electrode. An orthographic projection of the photoelectric conversion layer on the base substrate completely falls within an orthographic projection of the first electrode on the base substrate, the photoelectric conversion layer includes a sidewall, the orthographic projection of the sidewall of the photoelectric conversion layer on the base substrate is at least partially overlapped with an orthographic projection of the second electrode on the base substrate. The detection element can effectively reduce the dark-state leakage current generated by the photoelectric conversion layer, thereby improving the photoelectric characteristics of the detection element and the flat panel detector including the detection element.

Hereinafter, the detection element, the manufacturing method thereof and the flat panel detector provided by the embodiments of the present disclosure will be described with reference to the accompanying drawings.

Figure 2A:
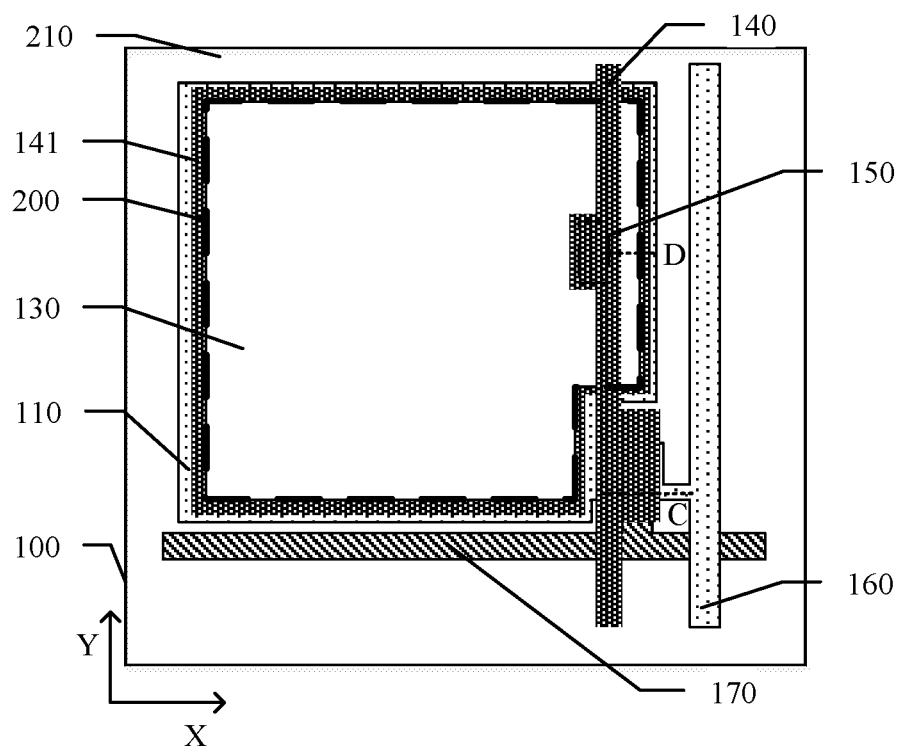
FIG. 2A is a schematic plan view of a detection element provided by an embodiment of the present disclosure.
Figure 2B:
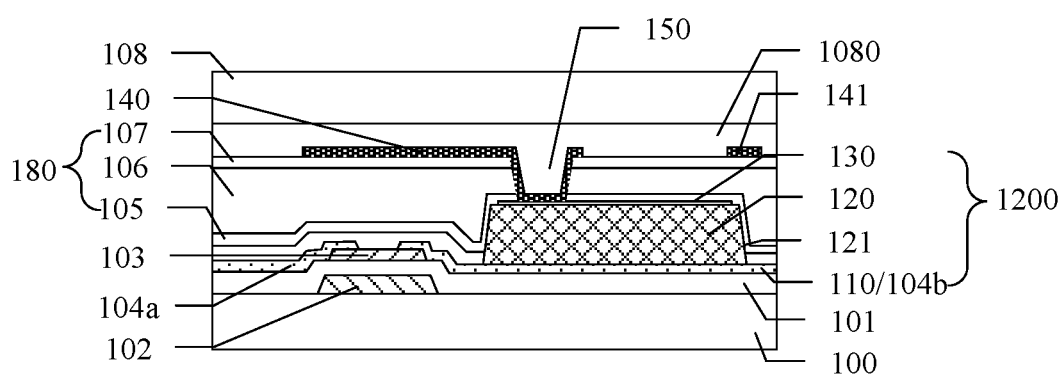
FIG. 2B is a schematic cross-sectional view of the detection element illustrated by FIG. 2A taken along a line CD.

FIG. 2A is a schematic plan view of a detection element according to an embodiment of the present disclosure, and FIG. 2B is a schematic cross-sectional view of the detection element illustrated by FIG. 2A taken along a line CD. In order to clearly illustrate a plan view of a first electrode, a transparent electrode, and a second electrode, some insulating layers are omitted in FIG. 2A. As illustrated by FIGS. 2A and 2B, a detection element according to an embodiment of the present disclosure includes a base substrate 100, a photodiode 1200 on the base substrate 100, the photodiode 1200 includes a first electrode 110 on the base substrate 100, a photoelectric conversion layer 120 located on a side of the first electrode 110 away from the base substrate 100, a transparent electrode 130 and a second electrode 141 electrically connected with the transparent electrode 130 on a side of the photoelectric conversion layer 120 away from the first electrode 110. Besides, an orthographic projection of the photoelectric conversion layer 120 on the base substrate 100 completely falls within an orthographic projection of the first electrode 110 on the base substrate 100, the photoelectric conversion layer 120 includes a sidewall 121, and an orthographic projection of the sidewall 121 of the photoelectric conversion layer 120 is at least partially overlapped with an orthographic projection of the second electrode 141 on the base substrate 100.

For example, as illustrated by FIG. 2B, the orthographic projection of the transparent electrode 130 on the base substrate 100 completely falls within the orthographic projection of the photoelectric conversion layer 120 on the base substrate 100, and is not overlapped with the orthographic projection of the sidewall 121 on the base substrate 100. That is to say, in a plane parallel to the base substrate 100 (i.e., in a plane parallel to X and Y directions), the transparent electrode 130 is located in a middle portion of the photoelectric conversion layer 120, and an orthographic projection of a portion of the photoelectric conversion layer 120 not covered by the transparent electrode 130 is at least partially overlapped with the orthographic projection of the second electrode 141 on the base substrate 100, that is, the orthographic projection of the transparent electrode 130 on the base substrate 100 is overlapped with a middle portion of the orthographic projection of the photoelectric conversion layer 120 on the base substrate 100, and a portion of the orthographic projection of the photoelectric conversion layer 120 which is not overlapped with the orthographic projection of the transparent electrode 120 is at least partially overlapped with the orthographic projection of the second electrode 141 on the base substrate 100.

For example, the sidewall of the photoelectric conversion layer may be perpendicular to the plane where the base substrate is located, the transparent electrode is located in an inner side of the sidewall, and the orthographic projection of the second electrode on the base substrate is overlapped with the orthographic projection of the sidewall of the photoelectric conversion layer on the base substrate, which can compensate a voltage difference generated by a portion of the photoelectric conversion layer not covered by the transparent electrode, thereby reducing the dark-state leakage current generated by the sidewall, and further improving the photoelectric characteristics of the flat panel detector including the detection element.

For example, as illustrated by FIG. 2B, a cross section of the photoelectric conversion layer 120 taken in a direction perpendicular to the base substrate 100 has a trapezoid shape (including a standard trapezoid shape and an approximately trapezoid shape, and the approximately trapezoid shape includes a case where a side connecting the two bases is a non-linear line, such as a curved line), a length of the base of the trapezoid shape on a side close to the transparent electrode 130 is smaller than a length of the base of the trapezoid shape on a side close to the first electrode 110, that is, the photoelectric conversion layer 120 has a inclined sidewall 121, and the second electrode 141 covers at least a part of the inclined sidewall of the photoelectric conversion layer 120. The transparent electrode and the second electrode in the present embodiment together serve as a top electrode of the photoelectric conversion layer, and the first electrode serves as a bottom electrode of the photoelectric conversion layer. In the present embodiment, the voltage difference generated by the inclined sidewall of the photoelectric conversion layer can be compensated by adding a part of the top electrode (the second electrode) on the sidewall of the photoelectric conversion layer, thereby reducing the dark-state leakage current generated by the sidewall, and further improving the photoelectric characteristics of the flat panel detector including the detection element.

For example, the photodiode 1200 in the present embodiment is a PIN type photodiode. The photoelectric conversion layer of the PIN photodiode includes a P layer, an I layer, and an N layer, where the I layer is an intrinsic semiconductor layer or a doped layer of a near-intrinsic semiconductor having a low doping concentration, and the I layer has a relatively large thickness, and occupies almost the entire depletion layer, and therefore most of light passed through the transparent electrode 130 and incident on the photoelectric conversion layer 120 is absorbed in the I layer and generates a large number of electron-hole pairs.

For example, as illustrated by FIGS. 2A and 2B, the orthographic projection of the portion of the photoelectric conversion layer 120 not covered by the transparent electrode 130 on the base substrate 100 completely falls within the orthographic projection of the second electrode 141 on the base substrate 100. That is to say, the second electrode 141 completely covers the inclined sidewall of the photoelectric conversion layer 120. In this case, the photoelectric conversion layer 120 is completely located between the top electrode (the transparent electrode 130 and the second electrode 141 together serving as the top electrode of the photoelectric conversion layer 120) and the bottom electrode (the first electrode 110), which can solve a problem that an electric field of the sidewall of the photoelectric conversion layer is weaker than that of the middle portion of the photoelectric conversion layer to the maximum extent, thereby effectively reducing the generation of leakage current.

For example, a case that the orthographic projection of the portion of the photoelectric conversion layer 120 not covered by the transparent electrode 130 on the base substrate 100 completely falls within the orthographic projection of the second electrode 141 on the base substrate 100 includes: in the plane parallel to the base substrate 100, the second electrode 141 is a ring of electrode layer surrounding the transparent electrode 130; or, the second electrode 141 covers both a portion of the photoelectric conversion layer 120 which has been covered by the transparent electrode 130 and the inclined sidewall of the photoelectric conversion layer 120. In a case where the second electrode 141 covers the portion of the photoelectric conversion layer 120 which has been covered by the transparent electrode 130, in order to guarantee an illuminated area of the photoelectric conversion layer 120 (i.e., the illuminated area of the photoelectric conversion layer 120 serves as an aperture ratio of an imaging unit), the second electrode 141 is selected as a transparent conductive electrode.

For example, as illustrated by FIGS. 2A and 2B, the second electrode 141 may just cover the inclined sidewall of the photoelectric conversion layer 120.

For example, as illustrated by FIGS. 2A and 2B, a material of the second electrode 141 in an example of the embodiment of the present disclosure includes a light shielding material, that is, the second electrode 141 may play a light shielding effect. An ordinary indirect flat panel detector converts X-ray light into visible light by using a scintillation layer, and the converted visible light is relatively divergent. The second electrode in the present embodiment has a certain light shielding effect on the sidewall of the photoelectric conversion layer, such that the irradiation of the divergent light on the sidewall of the photoelectric conversion layer (imaging unit) can be effectively reduced, thereby reducing the influence on the image quality. The detection element provided in the present embodiment is mainly applied to an indirect X-ray flat panel detector.

For example, as illustrated by FIGS. 2A and 2B, the orthographic projection of the portion of the photoelectric conversion layer 120 not covered by the transparent electrode 130 on the base substrate 100 completely falls within the orthographic projection of the second electrode 141 on the base substrate 100, in this case, the second electrode 141 can have a complete light-shielding effect on the inclined sidewall of the photoelectric conversion layer 120, and thus it is possible to further reduce the irradiation of the divergent light on the sidewall of the photoelectric conversion layer (imaging unit).

For example, as illustrated by FIGS. 2A and 2B, the orthographic projection of the transparent electrode 130 on the base substrate 100 is not overlapped with the orthographic projection of the second electrode 141 on the base substrate 100, that is, a portion of the photoelectric conversion layer 120 covered by the transparent electrode 130 is not overlapped with a portion of the photoelectric conversion layer 120 covered by the second electrode 141, so that it is possible to ensure that the sidewall of the imaging unit (photoelectric conversion layer) can be shielded while not affecting the aperture ratio of the imaging unit.

For example, the detection element includes an imaging region 200 and a peripheral region 210 surrounding the imaging region 200. The imaging region 200 is a region of dotted circle in FIG. 2A, i.e., a region where the transparent electrode 130 is located. The imaging region 200 is a region where the photoelectric conversion layer 120 is illuminated. The sidewall of the photoelectric conversion layer 120 and a region on an outer side of the sidewall are a non-imaged region, i.e., the peripheral region 210. The second electrode 141 is located in the peripheral region 210, which does not affect the aperture ratio of the imaging unit, prevents the divergent light from irradiating the sidewall of the photoelectric conversion layer (imaging unit), and may also shield the illumination of external environment light on a side of the second electrode away from the photoelectric conversion layer on the photoelectric conversion layer.

For example, as illustrated by FIGS. 2A and 2B, the detection element provided by the embodiment of the present disclosure further includes: a bias signal line 140 located on a side of the transparent electrode 130 away from the photoelectric conversion layer 120, the bias signal line 140 and the transparent electrode 130 are electrically connected. The bias signal line 140 is used to provide an external electric field to electrons and holes in the photoelectric conversion layer 120. Also, the second electrode 141 in the embodiment of the present disclosure is electrically connected with the bias signal line 140, that is to say, the bias signal line 140 supplies the second electrode 141 with the same voltage as the transparent electrode 130.

For example, as illustrated by FIGS. 2A and 2B, an orthographic projection of the bias signal line 140 on the base substrate 100 is overlapped with a portion of the orthographic projection of the photoelectric conversion layer 120 on the base substrate 100, and an orthographic projection of the portion of the photoelectric conversion layer 120 not covered by the transparent electrode 130 and the bias signal line 140 on the base substrate 100 completely falls within the orthographic projection of the second electrode 141 on the base substrate 100.

For example, as illustrated by FIGS. 2A and 2B, the detection element provided by the embodiment of the present disclosure further includes: an insulating layer 180 between the bias signal line 140 and the transparent electrode 130, and the insulating layer 180 includes a via hole 150, and the bias signal line 140 is electrically connected with the transparent electrode 130 through the via hole 150.

For example, as illustrated by FIG. 2B, the insulating layer 180 may include a buffer layer 105, a resin layer 106, and a passivation layer 107, the insulating layer 180 is used for protecting the photoelectric conversion layer 120.

For example, as illustrated by FIGS. 2A and 2B, the second electrode 141 is located on a side of the insulating layer 180 away from the transparent electrode 130.

For example, the second electrode may be located on a side of the bias signal line away from the photoelectric conversion layer, or may be located between the bias signal line and the photoelectric conversion layer.

For example, the second electrode 141 may be electrically connected with the transparent electrode 130 through electrical connection with the bias signal line 140, and the present embodiment includes but is not limited thereto.

For example, as illustrated by FIGS. 2A and 2B, an example of the present embodiment takes a case where the second electrode 141 and the bias signal line 140 are located in the same layer and have the same material as an example, that is, the second electrode 141 and the bias signal line 140 are formed through the same patterning process to the same conductive layer, thereby saving processing steps.

For example, the material of the second electrode 141 and the bias signal line 140 may include Ag (silver), Al (Aluminum), Mg:Ag (magnesium-silver alloy), Mg:Al (magnesium-aluminum alloy), Au (gold), or other opaque metal materials For example, as illustrated by FIGS. 2A and 2B, the detection element provided by the embodiment of the present disclosure further includes: a thin film transistor, including a gate electrode 102, an active layer 103, a source electrode 104*a* and a drain electrode 104*b*. In the present embodiment, a case where the drain electrode 104*b* is used as the first electrode 110 is described as an example.

For example, the thin film transistor further includes a gate insulating layer 101 on the gate electrode 102.

For example, as illustrated by FIGS. 2A and 2B, the detection element provided by the embodiment of the present disclosure further includes: a gate line 170 extending in the X direction and a data line 160 extending in the Y direction. The gate electrode 102 of the thin film transistor is electrically connected with the gate line 170, the gate line 170 is used to turn on or turn off the thin film transistor, the source electrode 104*a* of the thin film transistor is electrically connected with the data line 160, and the drain electrode 104*b* is electrically connected with the photoelectric conversion layer 120 as the first electrode 110. The photoelectric conversion layer 120 forms an electric field under a bias voltage provided by the bias signal line 140, and photoelectrons generated by the photoelectric conversion layer 120 after being irradiated by light are migrated and accumulated in the first electrode 110 by an external electric field. After the gate line 170 turning on the thin film transistor, the electrons accumulated in the first electrode 110 are read out through the data line 160, and converted into a digital signal by a reading chip, and the digital signal is subjected to an image processing at a backend.

For example, as illustrated by FIG. 2B, the detection element provided by the embodiment of the present disclosure further includes a passivation protective layer 1080 and a resin protective layer 108 on a side of the bias signal line 140 away from the photoelectric conversion layer 120. The two film layers are used to protect the bias signal line 140.

Figure 3:
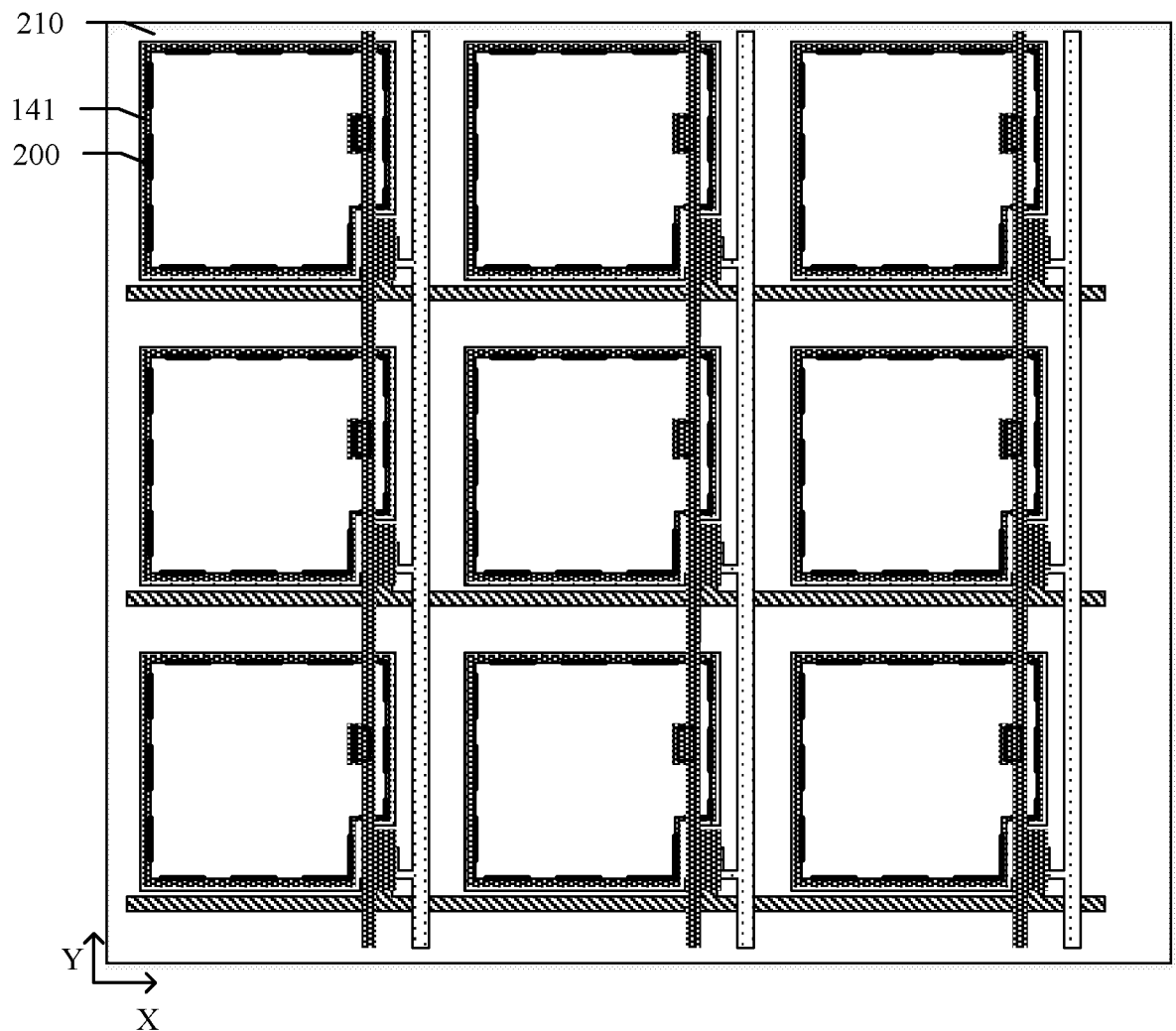
FIG. 3 is a partial plan view of a flat panel detector provided by another embodiment of the present disclosure.

FIG. 3 is a partial plan view of a flat panel detector according to another embodiment of the present disclosure. As illustrated by FIG. 3, the flat panel detector provided in the present embodiment includes the detection element provided in any of the above embodiments.

As illustrated by FIG. 3, the flat panel detector includes a plurality of detection elements arranged in an array, that is, the plurality of detection elements are arranged in the X direction and the Y direction.

For example, as illustrated by FIG. 3, the flat panel detector includes a plurality of imaging regions 200 (a region where the dotted circles are exited) and a peripheral region 210 surrounding the imaging region 200. For example, each of the detection elements includes a second electrode 141 located in the peripheral region 210 to cover at least a portion of the inclined sidewall of the photoelectric conversion layer.

For example, the flat panel detector provided in the present embodiment is an indirect flat panel detector.

In the present embodiment, the voltage difference generated by the inclined sidewall of the photoelectric conversion layer can be compensated by adding a part of the top electrode (second electrode) on the sidewall of each photoelectric conversion layer, thereby effectively overcoming the problem of insufficient bias voltage caused by the sidewall of the photoelectric conversion layer having a relatively small slope, thereby improving the photoelectric characteristics of the flat panel detector. In addition, the second electrode in an example of the present embodiment includes a light shielding material, so that it can also effectively reduce the irradiation of the divergent light on the sidewall of the photoelectric conversion layer (imaging unit), so that the influence on the image quality thereof can be reduced.

Figure 4:
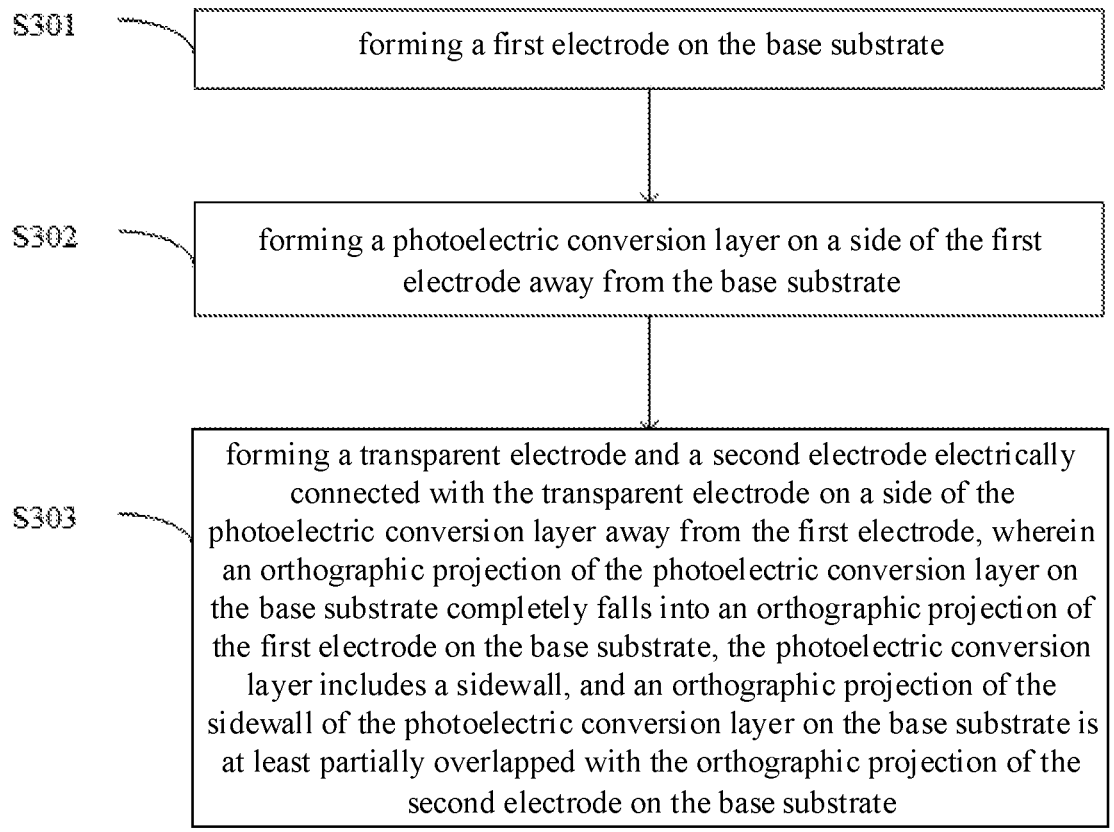
FIG. 4 is a schematic flowchart of a manufacturing method of a detection element provided by another embodiment of the present disclosure.

FIG. 4 is a schematic flowchart of a manufacturing method of a detection element according to another embodiment of the present disclosure. As illustrated by FIG. 4, the manufacturing method of the detection element includes: forming a photodiode on a base substrate, and forming the photodiode includes:

S301: forming a first electrode on the base substrate.

For example, before forming the first electrode on the base substrate, the formation of the detection element further includes: forming a thin film transistor on the base substrate. The formation of the thin film transistor includes: sequentially forming a gate electrode, a gate insulating layer, an active layer, a source electrode and a drain electrode. One of the formed source electrode and drain electrode serves as the first electrode of the detection element.

S302: forming a photoelectric conversion layer on a side of the first electrode away from the base substrate.

For example, the formed photoelectric conversion layer is a photoelectric conversion layer of a PIN type photodiode.

S303: forming a transparent electrode and a second electrode electrically connected with the transparent electrode on a side of the photoelectric conversion layer away from the first electrode, wherein an orthographic projection of the photoelectric conversion layer on the base substrate completely falls into an orthographic projection of the first electrode on the base substrate, the photoelectric conversion layer includes a sidewall, and an orthographic projection of the sidewall of the photoelectric conversion layer on the base substrate is at least partially overlapped with the orthographic projection of the second electrode on the base substrate.

For example, the formation of the second electrode includes: forming a second electrode on a side of a portion of the photoelectric conversion layer not covered by the transparent electrode away from the base substrate, such that an orthographic projection of the portion of the photoelectric conversion layer not covered by the transparent electrode completely falls within the orthographic projection of the second electrode on the base substrate.

For example, the orthographic projection of the portion of the photoelectric conversion layer not covered by the transparent electrode on the base substrate is at least partially overlapped with the orthographic projection of the second electrode on the base substrate, that is, the second electrode covers at least a part of the inclined sidewall of the photoelectric conversion layer. The transparent electrode and the second electrode in the present embodiment together serve as a top electrode of the photoelectric conversion layer, and the first electrode serves as a bottom electrode of the photoelectric conversion layer. The voltage difference generated by the inclined sidewall of the photoelectric conversion layer can be compensated by adding a part of the top electrode (second electrode) on the sidewall of the photoelectric conversion layer, thereby reducing the dark-state leakage current generated by the sidewall, and improving the photoelectric characteristics of a flat panel detector including the detection element.

For example, the orthographic projection of the portion of the photoelectric conversion layer not covered by the transparent electrode on the base substrate completely falls within the orthographic projection of the second electrode on the base substrate, that is, the second electrode completely covers the inclined sidewall of the photoelectric conversion layer. In this case, the photoelectric conversion layer is completely located between the top electrode (the transparent electrode and the second electrode together serving as the top electrode of the photoelectric conversion layer) and the bottom electrode (the first electrode), which can solve the problem that an electric field of the sidewall of the photoelectric conversion layer is weaker than that of the middle portion of the photoelectric conversion layer to the maximum extent, thereby effectively reducing the generation of leakage current.

For example, the situation that the orthographic projection of the portion of the photoelectric conversion layer not covered by the transparent electrode on the base substrate completely falls within the orthographic projection of the second electrode on the base substrate includes: in a plane parallel to the base substrate, the second electrode is a ring of electrode layer surrounding the transparent electrode; or, the second electrode covers both a portion of the photoelectric conversion layer which has been covered by the transparent electrode and the inclined sidewall of the photoelectric conversion layer. In a case where the second electrode covers the portion of the photoelectric conversion layer which has been covered by the transparent electrode, in order to guarantee an illuminated area of the photoelectric conversion layer (i.e., the illuminated area of the photoelectric conversion layer as an aperture ratio of an imaging unit), the second electrode is selected as a transparent conductive electrode.

For example, the second electrode may just cover the inclined sidewall of the photoelectric conversion layer.

For example, a material of the second electrode includes a light shielding material, that is to say, the second electrode may have a light shielding effect. Therefore, the second electrode has a certain light-shielding effect on the sidewall of the photoelectric conversion layer, so that the irradiation of the divergent light on the sidewall of the photoelectric conversion layer (imaging unit) can be effectively reduced, so that the influence on the image quality thereof can be reduced.

For example, in a case where the orthographic projection of the portion of the photoelectric conversion layer not covered by the transparent electrode on the base substrate completely falls within the orthographic projection of the second electrode on the base substrate, the second electrode may have a complete light shielding effect on the inclined sidewall of the photoelectric conversion layer, so that the irradiation of the divergent light on the sidewall of the photoelectric conversion layer (imaging unit) can be further reduced.

For example, the orthographic projection of the transparent electrode on the base substrate is not overlapped with the orthographic projection of the second electrode on the base substrate, that is, a portion of the photoelectric conversion layer covered by the transparent electrode is not overlapped with a portion of the photoelectric conversion layer covered by the second electrode, so that it is possible to ensure that the sidewall of the imaging unit (photoelectric conversion layer) can be shielded while not affecting the aperture ratio of the imaging unit.

For example, the manufacturing method of the detection element provided by the present embodiment further includes: forming an insulating layer on a side of the transparent electrode away from the photoelectric conversion layer; patterning the insulating layer to form a via hole; forming a conductive layer on a side of the insulating layer away from the transparent electrode, and the conductive layer being electrically connected with the transparent electrode through the via hole; patterning the conductive layer to form a bias signal line and a second electrode which are electrically connected with each other. The bias signal line is electrically connected with the transparent electrode through the via hole. The second electrode and the bias signal line in the present embodiment are formed by patterning the same conductive layer in the same step, thereby saving process steps. The process is based on the existing process, does not require additional equipment, and is only easy to implement for the shape of the existing film layer (the film layer where the bias signal line is located).

For example, a material of the second electrode and the bias signal line may include an opaque metal material, such as: Ag (silver), Al (aluminum), Mg:Ag (magnesium silver alloy), Mg:Al (magnesium aluminum alloy), Au (gold), and the like.

For example, in the present embodiment, the second electrode and the bias signal line are formed by patterning the same conductive layer in the same step, but the embodiment is not limited to a case that the second electrode and the bias signal line are formed by patterning the same conductive layer in the same step, for example, the bias signal lines and the second electrodes may also be formed in different processes.

For example, the insulating layer may include a buffer layer, a resin layer, and a passivation layer, and the insulating layer is used for protecting the photoelectric conversion layer.

For example, a passivation protective layer and a surface protective resin structure are formed on a side of the bias signal line away from the photoelectric conversion layer to protect the bias signal line.

The following statements should be noted:

(1) Unless otherwise defined, in embodiment(s) and accompanying drawings of the present disclosure, the same reference sign indicates the same meaning.

(2) The drawings accompanying the embodiment(s) of the present disclosure involve only the structure(s) in connection with the embodiment(s) of the present disclosure, and other structure(s) can be referred to common design(s)

(3) For the purpose of clarity only, in accompanying drawings for illustrating the embodiment(s) of the present disclosure, the thickness of a layer or an area may be enlarged. It should understood that, in the case in which a component such as a layer, film, area, substrate or the like is referred to be "on" or "under" another component, it may be directly on or under the another component, or a component may be interposed there-between.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. A detection element, comprising:
    a base substrate;
    a first electrode on the base substrate;
    a photoelectric conversion layer on a side of the first electrode away from the base substrate;
    a transparent electrode on a side of the photodiode away from the first electrode and a second electrode electrically connected with the transparent electrode,
    wherein an orthographic projection of the photoelectric conversion layer on the base substrate completely falls within an orthographic projection of the first electrode on the base substrate, in a plane parallel to the base substrate, the transparent electrode is located at a middle portion of the photoelectric conversion, an orthographic projection of a portion of the photoelectric conversion layer not covered by the transparent electrode on the base substrate at least partially falls within an orthographic projection of the second electrode on the base substrate,
    the detection element further comprises a bias signal line on a side of the transparent electrode away from the photoelectric conversion layer, wherein the bias signal line is electrically connected with the transparent electrode, and the second electrode is electrically connected with the bias signal line.

2. The detection element according to claim 1, wherein the orthographic projection of the portion of the photoelectric conversion layer not covered by the transparent electrode on the base substrate completely falls within the orthographic projection of the second electrode on the base substrate.

3. The detection element according to claim 1, further comprising: an insulating layer between the bias signal line and the transparent electrode, wherein the second electrode is on a side of the insulting layer away from the transparent electrode.

4. The detection element according to claim 1, wherein an orthographic projection of the second electrode on the base substrate falls within an orthographic projection of the first electrode on the base substrate.

5. The detection element according to claim 1, wherein a material of the second electrode comprises metal.

6. The detection element according to claim 1, further comprising: a thin film transistor comprising a source electrode and a drain electrode, wherein one of the source electrode and the drain electrode is the first electrode.

7. The detection element according to claim 6, wherein an orthographic projection of the bias signal line on the base substrate is overlapped with an orthographic projection of the thin film transistor on the base substrate.

8. The detection element according to claim 1, wherein a cross section of the photoelectric conversion layer taken in a direction perpendicular to the base substrate has a trapezoid shape, and a length of a base of the trapezoid shape close to the transparent electrode is smaller than a length of a base of the trapezoid shape close to the first electrode.

9. The detection element according to claim 1, wherein an orthographic projection of the bias signal line on the base substrate is overlapped with a portion of the orthographic projection of the photoelectric conversion layer on the base substrate, and an orthographic projection of a portion of the photoelectric conversion layer not covered by the transparent electrode and the bias signal line on the base substrate completely falls into the orthographic projection of the second electrode on the base substrate.

10. The detection element according to claim 3, wherein the insulating layer comprises a via hole, and the bias signal line is electrically connected with the transparent electrode through the via hole.

11. The detection element according to claim 1, wherein the second electrode and the bias signal line are in a same layer and materials of the second electrode and the bias signal line are the same.

12. The detection element according to claim 1, wherein the orthographic projection of the transparent electrode on the base substrate is not overlapped with the orthographic projection of the second electrode on the base substrate.

13. A flat panel detector, comprising a plurality of detection elements according to claim 1, wherein the plurality of the detection elements are arranged in an array.

14. The flat panel detector according to claim 13, wherein the flat panel detector is an indirect flat panel detector.

15. A manufacturing method of a detection element, comprising:
    forming a first electrode on a base substrate,
    forming a photoelectric conversion layer on a side of the base substrate away from the first electrode; and
    forming a transparent electrode on a side of the photoelectric conversion layer away from the first electrode, a second electrode electrically connected with the transparent electrode and a bias signal line, wherein the bias signal line is on a side of the transparent electrode away from the photoelectric conversion layer, the bias signal line is electrically connected with the transparent electrode, and the second electrode is electrically connected with the bias signal line, wherein an orthographic projection of the photoelectric conversion layer on the base substrate completely falls within an orthographic projection of the first electrode on the base substrate, in a plane parallel to the base substrate, the transparent electrode is located at a middle portion of the photoelectric conversion, an orthographic projection of a portion of the photoelectric conversion layer not covered by the transparent electrode on the base substrate at least partially falls within an orthographic projection of the second electrode on the base substrate.

16. The manufacturing method of the detection element according to claim 15, wherein the orthographic projection of the portion of the photoelectric conversion layer not covered by the transparent electrode on the base substrate completely falls within the orthographic projection of the second electrode on the base substrate.

17. The manufacturing method of the detection element according to claim 15, further comprising forming an insulating layer between the bias signal line and the transparent electrode, wherein the second electrode is on a side of the insulting layer away from the transparent electrode.

18. The manufacturing method of the detection element according to claim 15, an orthographic projection of the second electrode on the base substrate falls within an orthographic projection of the first electrode on the base substrate.

19. The manufacturing method of the detection element according to claim 15, wherein a material of the second electrode is metal.

20. The manufacturing method of the detection element according to claim 15, further comprising forming a thin film transistor comprising a source electrode and a drain electrode, wherein one of the source electrode and the drain electrode is the first electrode, an orthographic projection of the bias signal line on the base substrate is overlapped with an orthographic projection of the thin film transistor on the base substrate.

* * * * *

UNITED STATES PATENT AND TRADEMARK OFFICE
CERTIFICATE OF CORRECTION

| | |
|---|---|
| PATENT NO. | : 11,715,746 B2 |
| APPLICATION NO. | : 17/747055 |
| DATED | : August 1, 2023 |
| INVENTOR(S) | : Xuecheng Hou et al. |

It is certified that error appears in the above-identified patent and that said Letters Patent is hereby corrected as shown below:

On the Title Page

(73) Assignees Should read: BEIJING BOE OPTOELECTRONICS TECHNOLOGY CO., LTD., Beijing (CN); BOE TECHNOLOGY GROUP CO., LTD., Beijing (CN)

Signed and Sealed this
Seventeenth Day of September, 2024

Katherine Kelly Vidal
*Director of the United States Patent and Trademark Office*